(12) United States Patent
Dasnurkar

(10) Patent No.: US 8,310,385 B2
(45) Date of Patent: Nov. 13, 2012

(54) SYSTEMS AND METHODS FOR VECTOR-BASED ANALOG-TO-DIGITAL CONVERTER SEQUENTIAL TESTING

(75) Inventor: Sachin D. Dasnurkar, San Diego, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 157 days.

(21) Appl. No.: 12/777,091

(22) Filed: May 10, 2010

(65) Prior Publication Data

US 2010/0289679 A1  Nov. 18, 2010

Related U.S. Application Data

(60) Provisional application No. 61/177,841, filed on May 13, 2009.

(51) Int. Cl.
*H03M 1/10* (2006.01)
(52) U.S. Cl. .................. 341/120; 341/155; 714/718
(58) Field of Classification Search .......... 341/117–120, 341/155; 714/718
See application file for complete search history.

(56) References Cited

U.S. PATENT DOCUMENTS

| | | | |
|---|---|---|---|
| 5,659,312 A | 8/1997 | Sunter et al. | |
| 5,701,309 A | 12/1997 | Gearhardt et al. | |
| 5,854,598 A * | 12/1998 | De Vries et al. | 341/120 |
| 6,211,803 B1 * | 4/2001 | Sunter | 341/120 |
| 6,229,465 B1 * | 5/2001 | Bulaga et al. | 341/120 |
| 6,333,706 B1 * | 12/2001 | Cummings et al. | 341/120 |
| 6,492,923 B1 | 12/2002 | Inoue et al. | |
| 6,987,472 B2 * | 1/2006 | Lin | 341/120 |
| 7,271,751 B2 * | 9/2007 | Peterson et al. | 341/120 |
| 2002/0030615 A1 | 3/2002 | Cherubal et al. | |
| 2007/0192661 A1 | 8/2007 | Chang et al. | |
| 2008/0158026 A1 | 7/2008 | Obrien | |
| 2008/0158028 A1 * | 7/2008 | Yang et al. | 341/118 |
| 2008/0313510 A1 * | 12/2008 | Baker | 714/718 |

FOREIGN PATENT DOCUMENTS

EP  0447117 A2  9/1991

OTHER PUBLICATIONS

Erdem S Erdogan, et al., "An ADC-BiST Scheme Using Sequential Code Analysis" Design, Automation&Test in Europe Conference &Exhibition, 2007. Date '07, IEEE, PI, Apr. 1, 2007, pp. 1-6, XP031092194 ISBN: 978-3-9810801-2-4 the whole document.
Guo Yu, et al., "Achieving Low-Cost Linearity Test and Diagnosis of Sigma Delta ADCs via Frequency-Domain Nonlinear Analysis and Macromodeling" Quality Electronic Design, 2007. ISQED '07. 8th International SYM P0SIUM ON, IEEE, IEEE, PI, Mar. 1, 2007.
International Search Report and Written Opinion—PCT/US2010/034801, International Search Authority—European Patent Office—Sep. 7, 2010.
Azais, et al., "A Low-Cost BIST Architecture for Linear Histogram Testing of ADCs," Journal of Electronic Testing: Theory and Applications 17, pp. 139-147, 2001.

(Continued)

*Primary Examiner* — Jean Jeanglaude
(74) *Attorney, Agent, or Firm* — William M. Hooks

(57) ABSTRACT

A method for providing built-in self test (BiST) for an analog-to-digital converter (ADC) by automatic test equipment (ATE) is described. Output codes are received from the ADC. The output codes are translated to generate a functional pattern. Performance metrics are determined for the ADC using the functional pattern. The ADC may be on a device-under-test (DUT).

30 Claims, 15 Drawing Sheets

OTHER PUBLICATIONS

Azais, et al., "Implementation of a Linear Histogram BIST for ADCs," Design, Automation and Test in Europe, 2001. Conference and Exhibition 2001. Proceedings. pp. 590-595.

Azais F, et al., "A Low-Cost Adaptive Ramp Generator for Analog BIST Applications", VLSI Test Symposium, 19TH IEEE Proceedings On, VTS 2001 Apr. 29-May 3, 2001, Piscataway, NJ, USA, IEEE, Apr. 29, 2001, pp. 266-271, XP010542397.

B. Provost et al., "On-Chip Ramp Generators for Mixed Signal BIST and ADC Self-Test", IEEE Journal of Solid-State Circuits, vol. 38, pp. 263-273, 2003.

Bernard S et al., "A High Accuracy Triangle-Wave Signal Generator for On-Chip ADC Testing", Proceedings of the Seventh IEEE European Test Workshop (ETW 02), pp. 1530-1877, 2002.

Dasnurkar, et al., "Vector Based Analog to Digital Converter Sequential Testing Methodology to Minimize ATE Memory and Analysis Requirements," IEEE 15th International Mixed-Signals, Sensors, and Systems Test Workshop, 2009. IMS3TW '09, pp. 1-5.

Doernberg, et al., "Full-Speed Testing of A/D Converters," IEEE Journal of Solid-State Circuits, vol. SC-19, No. 6, Dec. 1984, pp. 820-827.

F. Azais et al., "Towards an ADC BIST Scheme Using the Histogram Test Technique", Proc. European Test Workshop, pp. 129-134, 2000.

Flores, et al., "INL and DNL Estimation Based on Noise for ADC Test," IEEE Transactions on Instrumentation and Measurement, vol. 53, No. 5, Oct. 2004, pp. 1391-1395.

International Technology Roadmap for Semiconductors 2008 Update, 79 pages.

J. L. Huang et al., "A BIST Scheme for On-Chip ADC and DAC Testing", Proc. Date 2000 Paris, France, pp. 216-220, Mar. 2000.

Renovell, et al., "Hardware Resource Minimization for Histogram-Based ADC BIST," Proceedings 18th IEEE VLSI Test Symposium, 2000, pp. 247-252.

S. Bernard et al., "Efficient On-Chip Generator for Linear Histogram BIST of ADCs", Proc. International Mixed-Signal Testing Workshop, 2001.

Serra, et al., "Combined Spectral and Histogram Analysis for Fast ADC Testing," IEEE Transactions on Instrumentation and Measurement, vol. 54, No. 4, Aug. 2005, pp. 1617-1623.

Tilden, et al., Overview of IEEE-STD-1241 "Standard for Terminology and Test Methods for Analog-to-Digital Converters," Proceedings of the 16th IEEE Instrumentation and Measurement Technology Conference, 1999, IMTC/99, vol. 3, pp. 1498-1503.

* cited by examiner

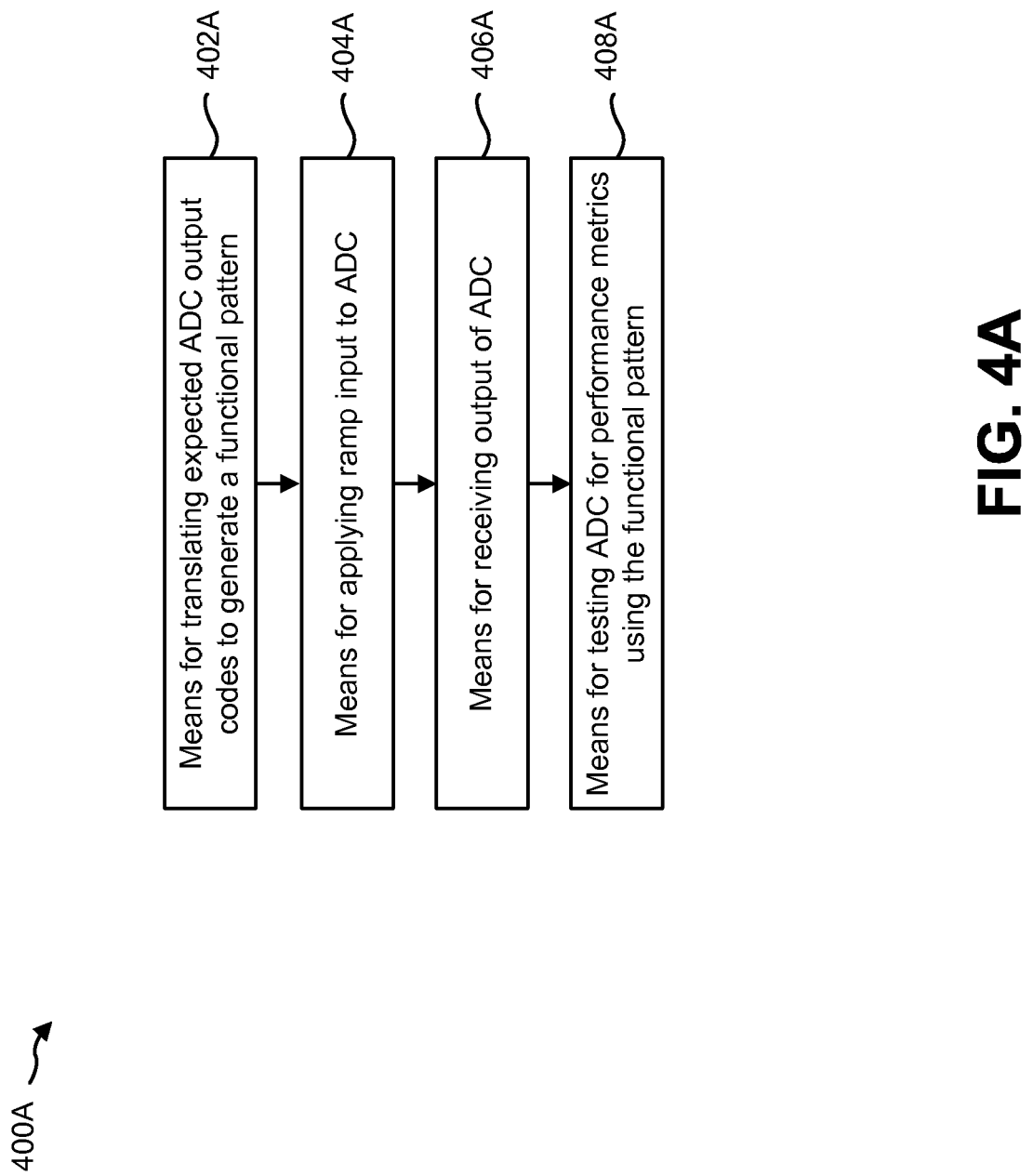

US 8,310,385 B2

SYSTEMS AND METHODS FOR VECTOR-BASED ANALOG-TO-DIGITAL CONVERTER SEQUENTIAL TESTING

RELATED APPLICATIONS

This application is related to and claims priority from U.S. Provisional Patent Application Ser. No. 61/177,841 filed May 13, 2009, for "Systems and Methods for Vector-Based Analog-To-Digital Converter Sequential Testing".

TECHNICAL FIELD

The present disclosure relates generally to electronic devices for communication systems. More specifically, the present disclosure relates to systems and methods for vector-based analog-to-digital converter sequential testing.

BACKGROUND

Electronic devices (cellular telephones, wireless modems, computers, digital music players, Global Positioning System units, Personal Digital Assistants, gaming devices, etc.) have become a part of everyday life. Small computing devices are now placed in everything from automobiles to housing locks. The complexity of electronic devices has increased dramatically in the last few years. For example, many electronic devices have one or more processors that help control the device, as well as a number of digital circuits to support the processor and other parts of the device.

This increased complexity has led to an increased need for testing that can test digital circuits and/or digital systems. Testing may be used to verify or test various parts of devices, such as pieces of hardware, software or a combination of both.

In many cases the equipment used to test a device is a separate piece of equipment than the device being tested. Some testing that takes place is performed substantially by the test equipment. Benefits may be realized by providing improved methods and apparatus for providing built-in self tests for electronic devices and/or components used in electronic devices.

BRIEF DESCRIPTION OF THE DRAWINGS

FIG. 4A illustrates means-plus-function blocks corresponding to the method of FIG. 4;

DETAILED DESCRIPTION

Figure 1:
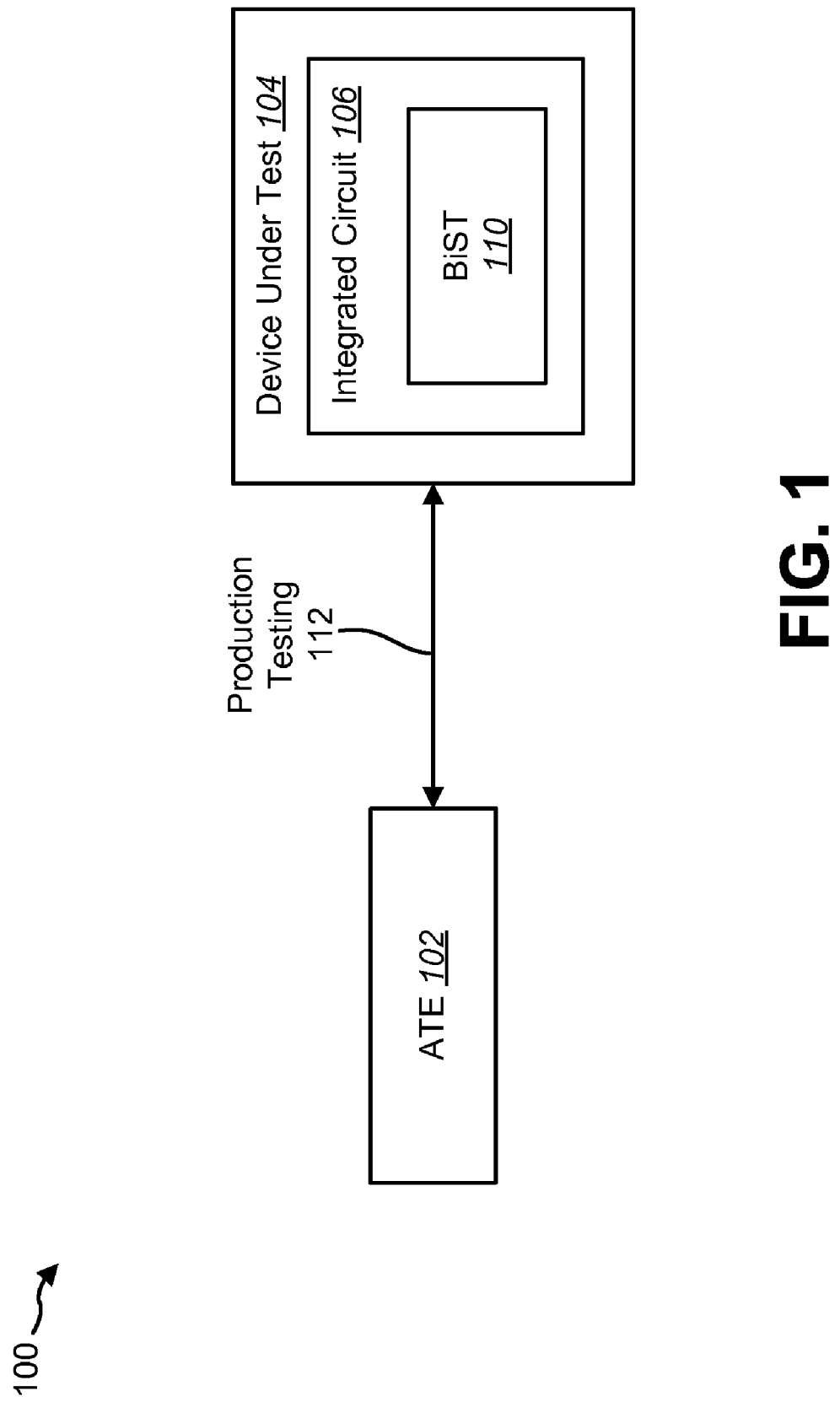
FIG. 1 shows a system for production testing of a device under test (DUT) with mixed signal circuitry.

A method for providing a built-in self test (BiST) for an analog-to-digital converter (ADC) by automatic test equipment (ATE) is described. Output codes are received from the ADC. The output codes are translated to generate a functional pattern. Performance metrics for the ADC are determined using the functional pattern.

Transition edges for the output codes may be determined. Differential Non-Linearity (DNL) errors corresponding to the transition edges may be determined using a lookup table. DNL errors may be a performance metric for the ADC. It may be determined whether the ADC has excessive DNL errors. The ADC may be on a device-under-test (DUT). It may be determined if the DUT is categorized as acceptable. It may be determined whether an adjacent output code has been erroneously generated by the ADC. It also may be determined whether the ADC has excessive Integral Non-Linearity (INL) errors. The INL errors may be a performance metric for the ADC.

A ramp input may be applied to the ADC. The ramp input may be generated by an input stimulus located on the same device-under-test as the ADC. The functional pattern may include ADC output vectors. An ADC output vector may be compared against an expected output code level to determine a voltage offset error. Voltage offset errors may be a performance metric of the ADC. It may be determined whether the voltage offset error on the ADC is excessive.

The first output code level may be [ . . . 000X]. The 'X' in the first output code level may represent a don't care operation. The ADC output vector may correspond to a minimum voltage of the ramp input. The first output code level may be [1 . . . 1X]. The ADC output vector may correspond to a maximum voltage of the ramp input. The ATE may be a very low cost ATE (VLC-ATE).

A wireless device configured for providing a built-in self test (BiST) for an analog-to-digital converter (ADC) is also described. The wireless device includes a processor, memory in electronic communication with the processor, and instructions stored in the memory. The instructions are executable by the processor to receive output codes from the ADC. The instructions are also executable by the processor to translate the output codes to generate a functional pattern. The instructions are further executable by the processor to determine performance metrics for the ADC using the functional pattern.

An apparatus for providing a built-in self test (BiST) for an analog-to-digital converter (ADC) is described. The apparatus includes means for receiving output codes from the ADC. The apparatus also includes means for translating the output codes to generate a functional pattern. The apparatus further includes means for determining performance metrics for the ADC using the functional pattern.

A computer-program product for a wireless device configured for providing a built-in self test (BiST) for an analog-to-digital converter (ADC) is also described. The computer-program product includes a computer-readable medium having instructions thereon. The instructions include code for receiving output codes from the ADC. The instructions also include code for translating the output codes to generate a functional pattern. The instructions further include code for determining performance metrics for the ADC using the functional pattern.

Many different kinds of electronic devices may benefit from testing. Different kinds of such devices include, but are not limited to, cellular telephones, wireless modems, computers, digital music players, Global Positioning System units, Personal Digital Assistants, gaming devices, etc. One group of devices includes those that may be used with wireless communication systems. As used herein, the term "mobile station" refers to an electronic device that may be used for voice and/or data communication over a wireless communication network. Examples of mobile stations include cellular phones, handheld wireless devices, wireless modems, laptop computers, personal computers, etc. A mobile station may alternatively be referred to as an access terminal, a mobile terminal, a subscriber station, a remote station, a user terminal, a terminal, a subscriber unit, user equipment, etc.

A wireless communication network may provide communication for a number of mobile stations, each of which may be serviced by a base station. A base station may alternatively be referred to as an access point, a Node B, or some other terminology. Base stations and mobile stations may make use of integrated circuits with mixed signal circuitry. However, many different kinds of electronic devices, in addition to the wireless devices mentioned, may make use of integrated circuits with mixed signal circuitry. Mixed signal circuitry may be circuitry that includes both analog and digital circuitry. Production of integrated circuits may result in process variations that affect the operation of the mixed signal circuitry. Accordingly, a broad array of electronic devices may benefit from the systems and methods disclosed herein.

Mixed signal circuits typically require more complex specification based testing as compared to digital circuits. Digital circuits may be completely tested with structural or simple functional tests. Due to the analog nature of some of the internal nodes along with the external signals in mixed signal circuits, qualitative functional tests may be required to assure circuit performance at all operating points. Mixed signal blocks such as analog-to-digital converters (ADC) and digital-to-analog converters (DAC) may act as interfaces between the processing modules on System on a Chip (SoC) blocks and analog domains.

ADCs and DACs are increasingly common on SoCs due to the increasing presence of real world analog signals that use the processing capabilities of the digital blocks. High volume production testing of these mixed signal components may be inefficient due to test complications, thereby resulting in the use of high-performance Automatic Test Equipment (ATE). While various Built-in Self Test (BiST) schemes have been proposed to provide an analog test stimulus, the conventional histogram analysis method is still in use for the majority of ADC testing applications.

Production testing of semiconductor devices typically involves the optimization of maintaining test quality to ensure a low defect rate in the final product while minimizing the overall test cost. Various matrices may be defined for test quality and the corresponding defect rates, which need to be adhered to with the available resources. Low cost testers have been developed in order to reduce test costs by downgrading ATE hardware resources. Providing voltage and timing resources for each pin on an ATE is one factor driving up the cost of ATE systems.

Some lower-cost ATEs attempt to minimize per pin hardware and provide a limited number of resource intensive pins for running hardware intensive tests. This approach may add constraints to test board design as well as multi-site testing, as the limited number of ATE resources may need to be allocated to multiple device under test (DUT) pins.

A wide range of Very Low Cost (VLC)-ATEs have been under development for semiconductor testing with minimal resources. These ATEs lower test cost by lowering system specifications. Compromises, such as less memory/processor resources, lower synchronous high speed operating frequency or limitations on resource intensive interface pins may be accepted to reduce the overall test cost.

Use of these VLC-ATEs may require a new set of stimulus generation and analysis methods to maintain the test coverage and quality of conventional high-resource methodologies with the reduced available resources. Vector based ADC sequential test methodology is directed at using lower computational and memory resources of the ATE. This supports the use of VLC-ATEs as data receivers and enables test decision making by real-time output observation with an ATE functional pattern.

An ADC output test involving a functional pattern may effectively result in a real-time code analysis. Memory and processing constraints for the ATE may be reduced as the vector based method is not ATE-memory intensive while providing a qualitative output quality measure, identical to the conventional histogram method.

In the conventional histogram method, a ramp input is provided to the ATE. Output data collection requiring ATE memory and computation resources is required to calculate the Integral Non-Linearity (INL) and Differential Non-Linearity (DNL) values. The conventional histogram method may include a basic code density test and/or methods for high and low code frequency testing. The measured output codes are stored in the memory while the data collection for a repeated ramp signal is completed. This stored data is then processed to extract the parametric specification values.

Vector based ADC testing may be a feasible alternative to the conventional histogram method to reduce ATE memory and data processing requirements. As the vector based approach screens for output data marginalities per cycle, no averaging artifacts causing error masking may be present. The specification values for various ADC parameters may be coded into the functional vector during the vector-generation phase. This scheme may be used with non-linear inputs such as sine waves, as long as the input signal waveform is deterministic.

FIG. 1 shows a system 100 for production testing 112 of a device under test (DUT) 104 with mixed signal circuitry. In one configuration, the DUT 104 may be a wireless device such as a mobile station or a base station. Alternatively, the DUT 104 may be a chip for use in a wireless device. In other configurations, the DUT 104 may not be a wireless device or part of a wireless device. The DUT 104 may be a mixed signal DUT (MS-DUT). The DUT 104 may include an integrated circuit 106. The integrated circuit 106 may include mixed signal circuitry. Mixed signal circuitry may be circuitry that includes both analog and digital circuitry.

The cost of testing mixed signal circuitry with a conventional analog-stimulus may be much higher than the cost of testing digital circuitry due to the higher cost of ATEs required for analog stimulus generation. Multiple variants of low cost testers have been developed for digital testing which rely on relaxed timing, power or tester channel requirements to lower hardware costs. An ATE 102 may be unable to test integrated circuits 106 including mixed-signal/RF components due to the limitations of such ATE 102: the lack of analog/RF stimulus and measurement modules. Analog blocks are increasingly common on digital Application Specific Integrated Circuits (ASICs), System on a Chip (SoC) and System in a Package (SiP) modules.

One factor for using a low cost ATE 102 such as a VLC-ATE to test mixed signal integrated circuits 106 is an on-chip generated self-test stimulus. The self-test stimulus may generate an input or signal for testing purposes. The self-test stimulus may be part of a Built-in Self Test (BiST) 110. The BiST 110 may be on the integrated circuit 106. A VLC-ATE may be unable to provide a test stimulus externally. Conventional mixed signal test methods tend to be ATE resource intensive due to the analog input or output signals required to drive or observe the DUT 104. The resource requirements may exist in the form of signal generation capability. For example, a linear ramp may be required at the ADC input terminal for complete function testing. The resource requirements may also exist in the form of ATE signal acquisition. For example, an ATE 102 may need high speed capability for observing a phase locked loop (PLL) output signal. The ATEs 102 required for such testing hence needs to support these high resource requirements.

Figure 2:
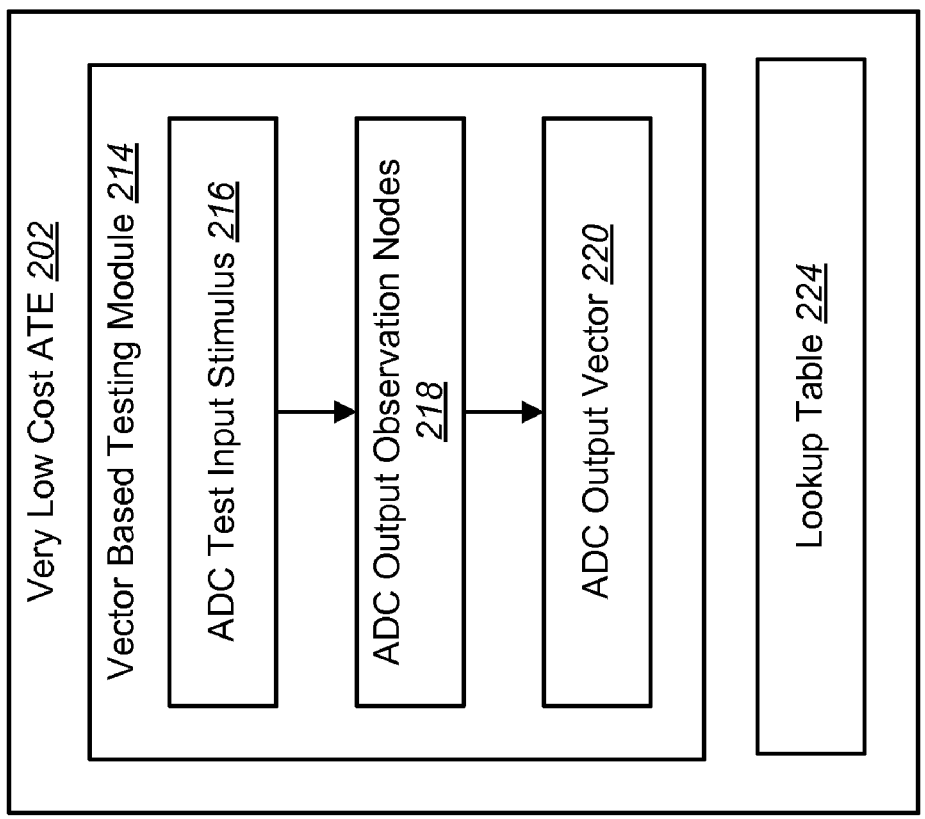
FIG. 2 is a block diagram illustrating various components of one configuration of very low cost automatic test equipment (VLC-ATE) used for testing an analog to digital converter (ADC)

FIG. 2 is a block diagram illustrating various components of one configuration of very low cost automatic test equipment (VLC-ATE) 202 used for testing an analog to digital converter (ADC). The VLC-ATE 202 of FIG. 2 may be one configuration of the ATE 102 of FIG. 1. Using a low functionality VLC-ATE 202 for semiconductor production testing 112 may enable cost reduction while innovative BiST solutions may be required to maintain test quality. Diminishing fabrication cost/device ratio with sub 100 nanometer (nm) fabrication nodes has increased the tolerance for the silicon overheads that are required by most BiST 110 schemes. Semiconductor test cost has linearly increased over multiple decades due to increasing ATE complexity, while the fabrication cost per component has reduced with each technology node. The International Technology Roadmap of Semiconductors predicts an approximate cost/transistor reduction of 29% between successive technology nodes. In contrast, the ATE test cost is expected to increase linearly per decade, independent of the process nodes being tested.

Instead of using the conventional histogram method for production testing 112, functional patterns for observing ADC output signals may be used. The various parameters used to characterize ADC performance may be translated in terms of a digital functional pattern. The digital functional pattern may observe digital outputs of the ADC and compare the digital voltage levels against the predetermined levels programmed in the pattern for the specific pattern cycles.

This scheme may be compatible with ADC configurations with DUT pin access available for the n-bit ADC output as well as schemes where no direct test access may be available. If the ADC nodes are not externally accessible, a scannable scheme may be implemented which can serially scan out the ADC output. This serial data stream may be observed and compared against the functional pattern constraints. No additional data gather time or component overhead may be necessary on the DUT 104 for the real time sequential test methodology over the conventional histogram method, as the data stream output in parallel or serial format remains unchanged between the two methods. The sequential test methodology may offer lower test time as well as relaxed memory and processing requirements.

The VLC-ATE 202 may include a vector based testing module 214. The vector based testing module 214 may perform vector based testing on a DUT 104. The vector based testing module 214 may apply an ADC test input stimulus 216 to the DUT 104. The vector based testing module 214 may include provisions to observe an ADC output vector 220 from ADC output observation nodes 218. The ADC output vector 220 may be received directly from an ADC being tested on a DUT 104. Alternatively, as discussed above, a scannable scheme may be implemented which can serially scan out the ADC output vector 220 from the DUT 104.

The vector based testing module 214 may include ADC output vector observation nodes 218. The ADC output vector observation nodes 218 may include the digital interface between the ATE 202 and the ADC output ports. The ADC output vector observation nodes 218 may be used to observe the ADC output vector 220 in test mode. Functional testing and analysis of the ADC may then be performed by the vector based testing module 214, based on the ADC output vector 220. The ADC output vector 220 may be the digital output of the ADC, which is observed by the vector based testing module 214.

The VLC-ATE 202 may also include one or more lookup tables 224. A lookup table may be in the form of vector memory where the expected output values for corresponding samples are stored. The VLC-ATE 202 may use the lookup tables 224 to compare the output against standard expected output vectors. These lookup tables may include ADC digital output codes and their corresponding resulting INL, DNL, and offset voltage values. The lookup tables 224 are discussed in further detail below in relation to FIG. 7.

Figure 3:
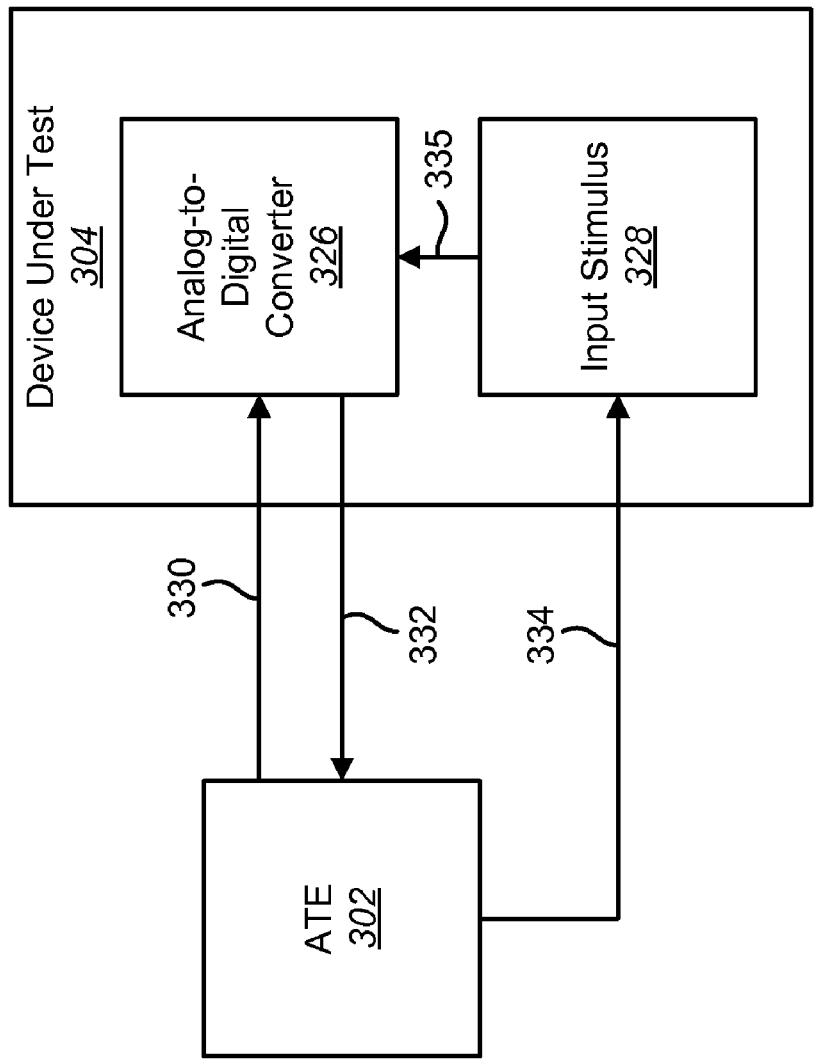
FIG. 3 is a block diagram illustrating various components of a device under test (DUT) including an input stimulus for generating a self-test input signal.

FIG. 3 is a block diagram illustrating various components of a device under test (DUT) 304 including an input stimulus 328 for generating a self-test input signal. The DUT 304 of FIG. 3 may be one example of the DUT 104 of FIG. 1. The input stimulus 328, which is part of the DUT 304, may enable self testing. The DUT 304 may be a mixed signal DUT (MS-DUT). The DUT 304 may include an analog-to-digital converter (ADC) 326. Production level testing of the ADC 326 may be desired. In one configuration, the DUT 304 may include an input stimulus 328. The input stimulus 328 may be part of a BiST 110 scheme. The input stimulus 328 may apply a linearly increasing ramp voltage to the ADC 326. The input stimulus 328 may receive instructions 334 from an ATE 302.

The ADC 326 may receive the linearly increasing ramp voltage 335 from the input stimulus 328. Alternatively, the ADC 326 may receive a linearly increasing ramp voltage 330 from the ATE 302. The ADC 326 may perform analog-to-digital conversion on the received ramp voltage. The ADC 326 may then output a digital output 332. The ADC output 332 may be sent to the ATE 302. The ADC output 332 may allow production testing 112 of the ADC 326 by the ATE 302.

Figure 4:
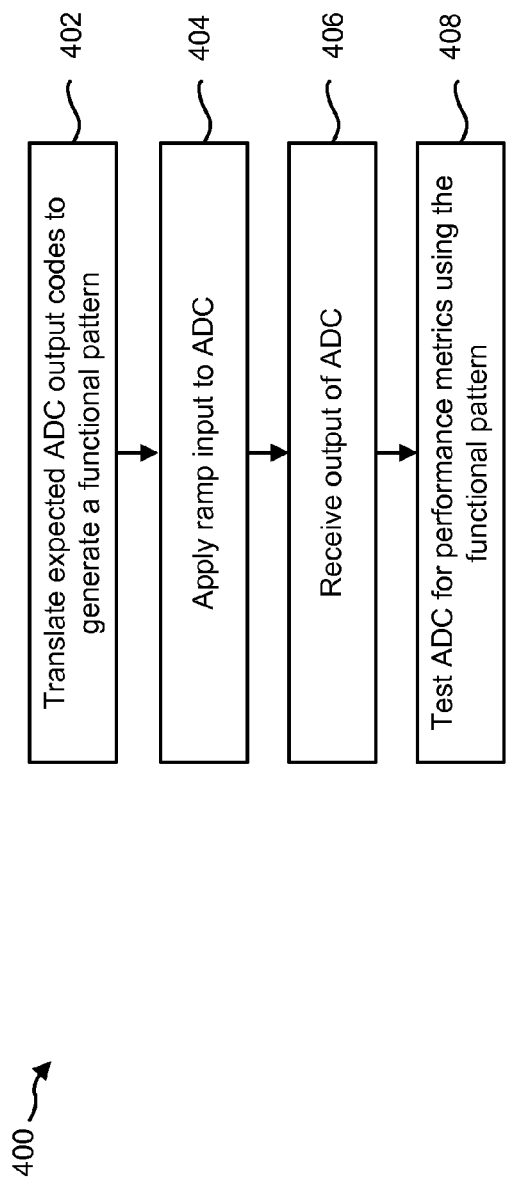
FIG. 4 is a flow diagram illustrating a method for vector based analog to digital converter (ADC) sequential testing.

FIG. 4 is a flow diagram illustrating a method 400 for vector based analog to digital converter (ADC) 326 sequential testing. The expected ADC output codes may be translated 402 to generate a functional pattern. This function pattern may be customized for the ADC performance that needs to be tested with the scheme. The functional pattern may be saved as a lookup table 224 in the vector memory on the ATE 202. An ADC 326 for testing may be part of an integrated circuit 106 located on a DUT 104. An ATE 102 may apply 404 a ramp input to the ADC 326. In one configuration, the ATE 102 may directly apply 404 the ramp input to the ADC 326.

Alternatively, the ATE 102 may instruct a ramp generator on the integrated circuit 106 to apply 404 a ramp input to the ADC 326.

The ATE 102 may then receive 406 the output of the ADC 326. The ATE may test 408 the ADC 326 output codes with the functional pattern stored in the lookup table 224 or vector memory to determine compliance with the DUT specifications which govern the functional pattern. The ATE 102 may then compare the ADC 326 output with performance metrics for the ADC 326 using the functional pattern. The ATE 102 may determine whether the DUT 104 meets performance requirements. The DUT 104 may be passed or accepted if the DUT 104 meets the performance metrics. The DUT 104 may be marked as a fail and discarded if the performance metrics are not met.

The performance quality of an ADC 326 may be judged by various measures. Some of the crucial performance metrics for an ADC 326 include Integral Non-Linearity (INL), Differential Non-Linearity (DNL), voltage offset, and gain. A lot of effort in ADC 326 test as well as BiST 110 design has been focused on calculating these parameters for an ADC 326. Efficient methods to calculate these measures with minimal BiST 110 area overhead and test time have been proposed. Use of a vector based test that uses a lookup table 224 or a vector memory may reduce the ATE 102 system requirements while ensuring compliance with performance metrics.

In the histogram test method, a characterized input signal (ramp, sinusoidal, etc.) may be provided to the ADC 326 with data padding provided at the $V_{min}$ and $V_{max}$ range extremes of the ADC 326. Multiple repeated instances of the input waveform may be applied to the DUT 104 and the resulting output measurements may be represented as a histogram for further analysis. The histogram method of ADC 326 analysis may use ATE 102 memory to store the output code samples collected from the DUT 104. The ATE 102 computing resources may be used to perform the analysis. Thus, the histogram method may require adequate storage memory and computing power in the ATE 102 to ensure that test times do not drastically increase as a result.

Complete characterization of an ADC 326 may involve computing DNL, INL, voltage offset error and gain with the data collected in the form of a histogram. An ideal ADC transfer function would contain a uniform distribution of histogram bins for a linear input signal provided. The distribution would contain regularity defects in case a practical ADC 326 causes a non-uniform histogram.

The method 400 of FIG. 4 described above may be performed by various hardware and/or software component(s) and/or module(s) corresponding to the means-plus-function blocks 400A illustrated in FIG. 4A. In other words, blocks 402 through 408 illustrated in FIG. 4 correspond to means-plus-function blocks 402A through 408A illustrated in FIG. 4A.

Figure 5:
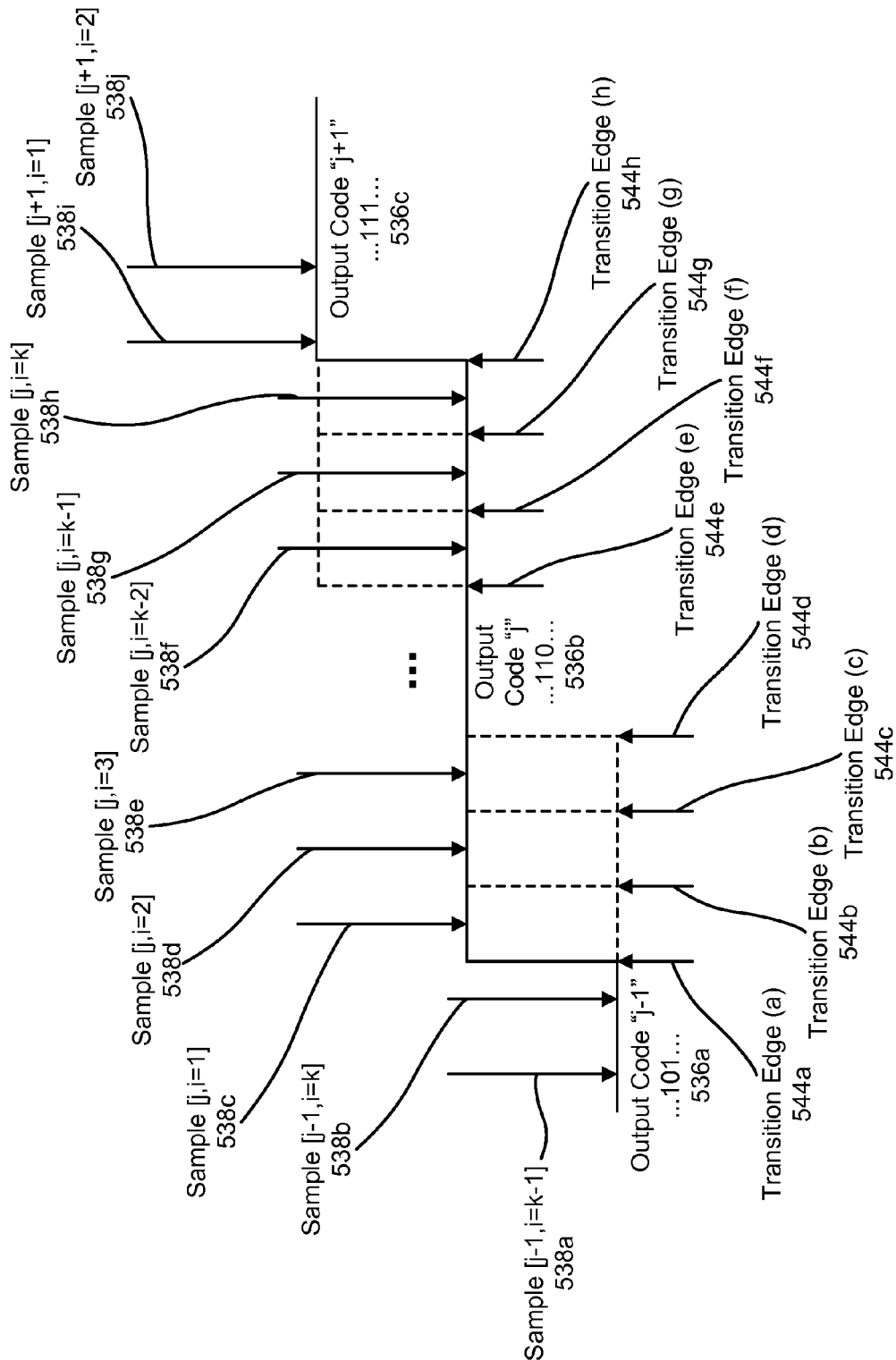
FIG. 5 is a graph illustrating digital vectors used for functional testing of an ADC.

FIG. 5 is a graph illustrating digital vectors used for functional testing of an ADC. Digital vectors or patterns may be widely used for structural and functional testing of digital output signals. These vectors may contain the input data as well as checks for observing the circuit response output. The edge timing information for driving and receiving data may be defined separately. The vector may be programmed to observe an output node in a specified time window.

In FIG. 5, three successive output code levels 536 of an ADC 326 are shown. The successive output code levels 536 may be referred to as output code level "j−1" 536a, "j" 536b, and "j+1" 536c. The clock frequency supplied to an ADC may be referred to as the sampling frequency $f_s$. An output code 538 may be generated by the ADC 326 every $1/f_s$ seconds. The number of output codes 538 generated for each output code level 536 in a test window may be referred to as the hits per code (HPC). If a linear ramp input is assumed as a test stimulus, an n-bit ADC test with HPC=1 will have output samples generated for transition from code [0 . . . 0] to [1 . . . 1] according to Equation (1):

$$\frac{1}{f_s} \times 2^n. \tag{1}$$

All practical ADC tests involve HPC values that are greater than 1. For example, ADC tests with HPC=k result in k output codes 538 generated per output code level 536. Each output code 538 may include the output code level 536 corresponding to the output code 538. In FIG. 5, multiple output codes 538a-j are shown. Each output code 538 may be separated by $$\frac{1}{k \times f_s}$$

in time, which is the ideal code duration per ADC 326 output step. For an ADC 326 clocked at a frequency of $f_s$ with HPC=k, the one-to-many relationship between the output codes 538 and the corresponding instantaneous input ramp values may be represented using Equation (2):

$$\text{Ramp}[i] \leftrightarrow ADC_{out}[j] \tag{2}$$

$$\text{for } i = t' \text{ to } \frac{1}{f_s} \times k.$$

Possible transition edges for the ADC output to move from output code level 536a to output code level 536b or from output code level 536b to output code level 536c are denoted by 544. For example, the output code Sample[j, i=1] 538c may occur at the transition edge 544a. For a non-ideal test case, the transition between output code level 536a and output code level 536b may also occur at transition edge 544b. The transition edges 544a-h between output code levels 536 at ideal and non-ideal instances are noted by Transition edge (a . . . h). Samples (i=1 . . . k) denote the k hits per code. Transition edge 544a denotes the ideal condition for switching from output code level 536a to output code level 536b while transition edge 544h denotes the ideal condition for switching from output code level 536b to output code level 536c.

Figure 6:
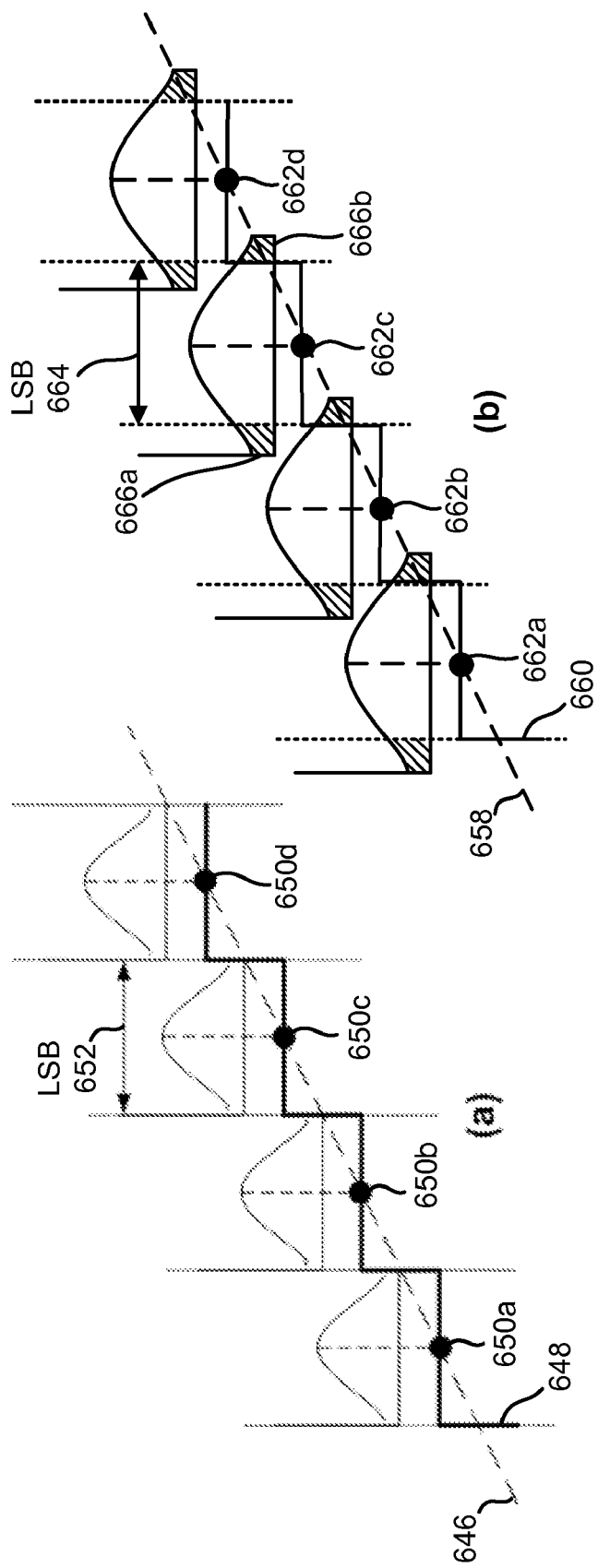
FIG. 6 illustrates ideal and erroneous code center distributions observed while testing an ADC.

FIG. 6 illustrates ideal and erroneous code center distributions observed while testing an ADC 326. If an n-bit ADC 326 is operating at a sampling frequency of $f_{opr}$, an n-bit digital code 538 may be output every $$\frac{1}{f_{opr}}$$

seconds. The width between two successive codes 538 may be referred to as the least significant bit (LSB) 652, 664. The ADC sampling frequency may correspond to the ADC clocking frequency. If HPC=1 for the input ramp stimulus, the ideal response distribution is shown in FIG. 6(a), with the ramp input 646 superimposed on the output step waveform 648. Ideally, each sampling instance 650a-d falls at the exact center of the output step. For an ideal ADC, each output code 536 may have a cardinal relationship with a specific point on the input ramp 646, which is repeatable in nature. For a practical and functional ADC 326, the code-center distribution may be assumed to be Gaussian in nature. In FIG. 6(*a*), an error-free DUT response distribution is shown where the code center has a tight distribution (process capability index (CpK)≧1.3) or the process capability number indicates that the entire standard deviation distribution is within the specific limits, which is the code boundary in this case.

The actual response distribution for an ADC 326 with HPC=1 is shown in FIG. 6(*b*), with the ramp input 658 superimposed on the output step waveform 660. Each sampling instance 662*a*-*d* may not fall at the exact center of the output step. The outlier points 666*a*, 666*b* in the code distribution are shaded in FIG. 6(*b*). These outlier points 666 in the code distribution fall under adjacent bins, resulting in a non-zero DNL error. The Gaussian distribution shown in FIG. 6 may be represented in terms of DNL if the timing variation distribution for the code center is characterized.

Figure 7:
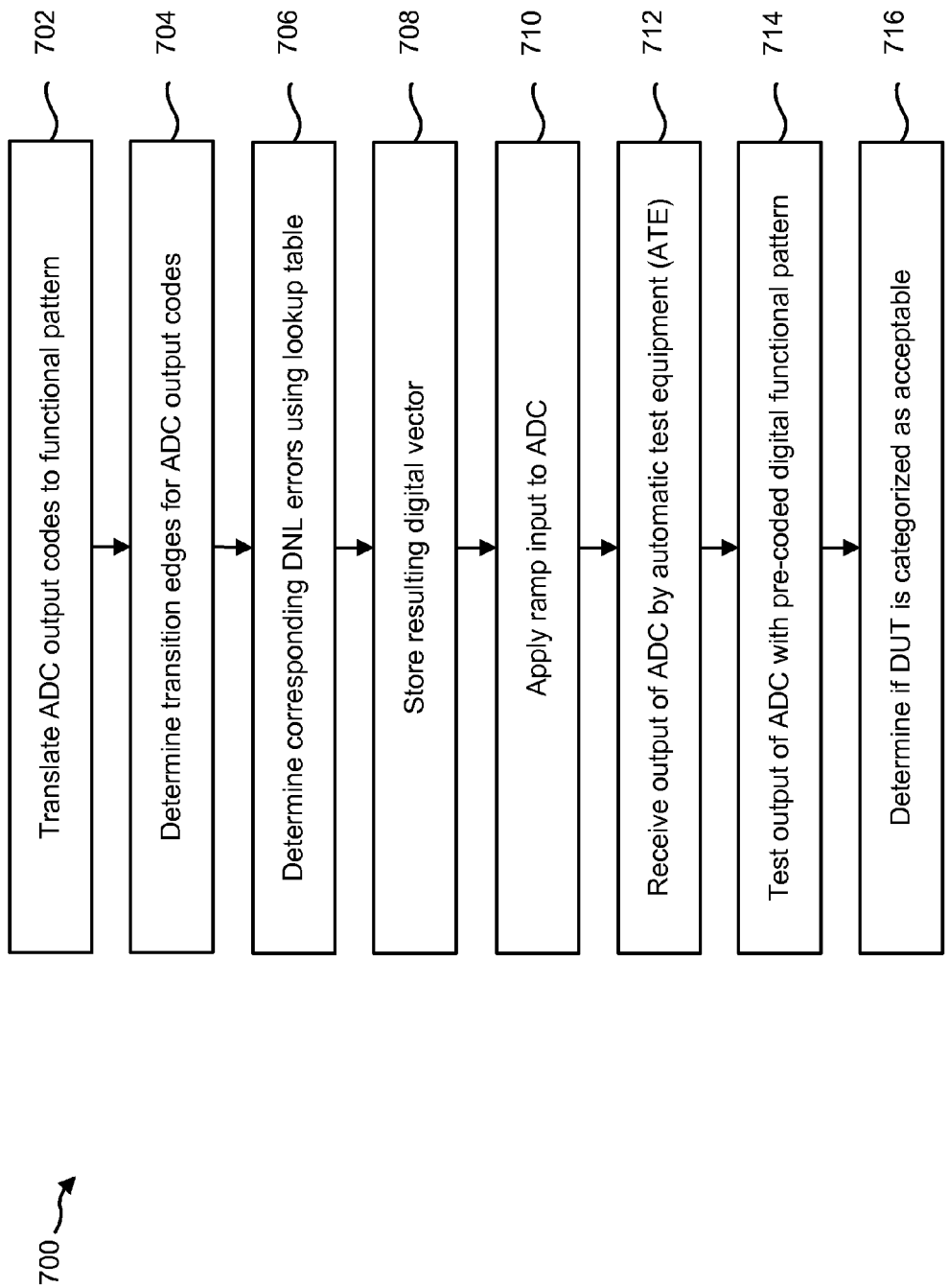
FIG. 7 is a flow diagram illustrating a method for vector based analog to digital converter (ADC) sequential testing of Differential Non-Linearity (DNL) errors.

FIG. 7 is a flow diagram illustrating a method 700 for vector based analog to digital converter (ADC) 326 sequential testing of Differential Non-Linearity (DNL) errors. The ADC 326 may be located on a DUT 104. DNL may be defined as the relative difference between the observed and ideal code counts. Thus, DNL may be calculated using Equation (3):

$$DNL(i) = \frac{H(i) - H(\text{ideal})}{H(\text{ideal})} \quad (3)$$

where H(i) represents the $i^{th}$ output code 538 of the ADC 326.

When observed in terms of the ADC output response to a linear ramp input, DNL can be defined as the difference between the actual step width and the value of 1 LSB. A DNL error specification may be defined to be ≦1 LSB to ensure a monotonic transfer function with no missing codes. In other words, the ADC output should increase or remain constant for an increasing input signal. The ideal code width may be 1 LSB.

Actual ADC output codes 538 may be translated 702 into a functional pattern. Computing resources may be used to translate 702 the ADC output codes 538 into the functional pattern. Transition edges for the ADC output codes 538 may be determined 704. The corresponding DNL errors may be calculated 706 using a lookup table 224. The resulting digital vector may be stored 708 in the lookup table 224 or vector memory for future ADC test use.

An ATE 102 may apply 710 a ramp input to the ADC 326. The ramp input may be a linear ramp input. The ramp input may be generated on-chip or off-chip. The ATE 102 may then receive 712 the output of the ADC 326. The output of the ADC 326 may be tested 714 with a pre-coded digital functional pattern. It may then be determined 716 whether to categorize the DUT 104 as a pass or a fail depending on the results after comparing the DUT output with the digital pattern customized for DUT performance metrics.

For an ADC 326 with finite LSB DNL error, the probability of error function for any recorded output sample digit is given in Equation (4):

$$P_e[l,m,0/1]=0 \quad (4)$$

where l=0 to $2^n$ and m=0 to n. 0→Error when ideal bit value is 0 while the recorded bit shows an erroneous 1; 1→Error when ideal bit value is 1 and the recorded bit shows an erroneous 0.

A functional pattern used to observe the 3×k output samples 538 for codes [ . . . 101 . . . , . . . 110 . . . , . . . 111 . . . ] is represented in Table 1, where 0→Expecting digit 0 and 1→Expecting digit 1.

TABLE 1

| Sample | ADC Response |
|---|---|
| [j − 1, i = 1] | . . . 1 0 1 . . . |
| Repeated k times total | |
| [j − 1, i = k] | . . . 1 0 1 . . . |
| [j, i = 1] | . . . 1 1 0 . . . |
| Repeated k times total | |
| [j, i = k] | . . . 1 1 0 . . . |
| [j + 1, i = 1] | . . . 1 1 1 . . . |
| Repeated k times total | |
| [j + 1, i = k] | . . . 1 1 1 . . . |

The ideal step transition would result in transition edge (a) 544*a* for [ . . . 101 . . . → . . . 110 . . . ] and transition edge (h) 544*h* for [ . . . 110 . . . → . . . 111 . . . ] with DNL=0.

A practical ADC test situation may involve a non-zero DNL. A maximum allowable limit may be set for the measured DNL value if the DUT 104 is to be categorized as acceptable. If the measured DNL value is greater than the maximum allowable limit, the ADC 326 may be characterized as having excessive DNL errors. The ATE 102 may determine 704 the transition edges 544 for the ADC output codes 538.

If the [ . . . 101 . . . → . . . 110 . . . ] transition follows the transition edge (b) 544*b*, the sampled output [j, i=1] 538*c* may read a [ . . . 101 . . . ] 536*a* instead of the expected ideal [ . . . 110 . . . ] 536*b*. However, the sampled output [j, i=2] 538*d* may still represent the ideal expected code output value [ . . . 110 . . . ] 536*b*. The DNL error observed in this case is $$\frac{1}{f_s \times k}$$

seconds or $$\frac{1}{k} \times LSB.$$

The DNL errors corresponding to some of the transition edge combinations are represented in Table 2.

TABLE 2

| Transition Edges | Effective DNL Value |
|---|---|
| (a), (h) | 0 × LSB |
| (b), (h) | $\frac{1}{k} \times LSB$ |
| (c), (h) | $\frac{2}{k} \times LSB$ |
| (a), (e) | $\frac{2}{k} \times LSB$ |

TABLE 2-continued

| | |
|---|---|
| (b), (e) | $\frac{3+1}{k} \times \text{LSB}$ |
| (c), (e) | $\frac{2+3}{k} \times \text{LSB}$ |

The ATE 102 may use a lookup table 224 similar to Table 2 to determine the DNL errors corresponding to the determined transition edges 544. If the DNL value of $$\frac{1}{k} \times LSB$$

is accepted as a test guardband, the functional pattern may be modified to accommodate "don't care" or X symbols where the observed output bit is discarded and not used for decision making. Therefore, the vector line corresponding to sample [j, i=1] 538c in Table 1 can be changed from [ . . . 1 1 0 . . . ] to [ . . . 1XX . . . ]. DNL errors may thus be translated into the compare bits in a functional pattern. If the allowable DNL errors for an ADC 326 are $$\frac{2}{k} \times LSB,$$

Table 1 may be rewritten with the changes in the bit compare values as Table 3.

TABLE 3

| Sample | ADC Response |
|---|---|
| [j − 1, i = 1] | . . . 1 0 X . . . |
| [j − 1, i = 2] | . . . 1 0 1 . . . |
| Repeated k times total | |
| [j − 1, i = k − 1] | . . . 1 0 1 . . . |
| [j − 1, i = k] | . . . 1 X X . . . |
| [j, i = 1] | . . . 1 X X . . . |
| [j, i = 2] | . . . 1 1 0 . . . |
| Repeated k times total | |
| [j, i = k − 1] | . . . 1 1 0 . . . |
| [j, i = k] | . . . 1 X X . . . |
| [j + 1, i = 1] | . . . 1 X X . . . |
| [j + 1, i = 2] | . . . 1 1 1 . . . |
| Repeated k times total | |
| [j + 1, i = k] | . . . 1 1 1 . . . |

Based on the determined transition edges 544 for the ADC codes 538, the ATE 102 may use a table such as Table 3 to determine 706 the corresponding DNL errors. The ATE 102 may then use the functional pattern to determine 716 if the DUT 104 is categorized as acceptable.

Figure 7A:
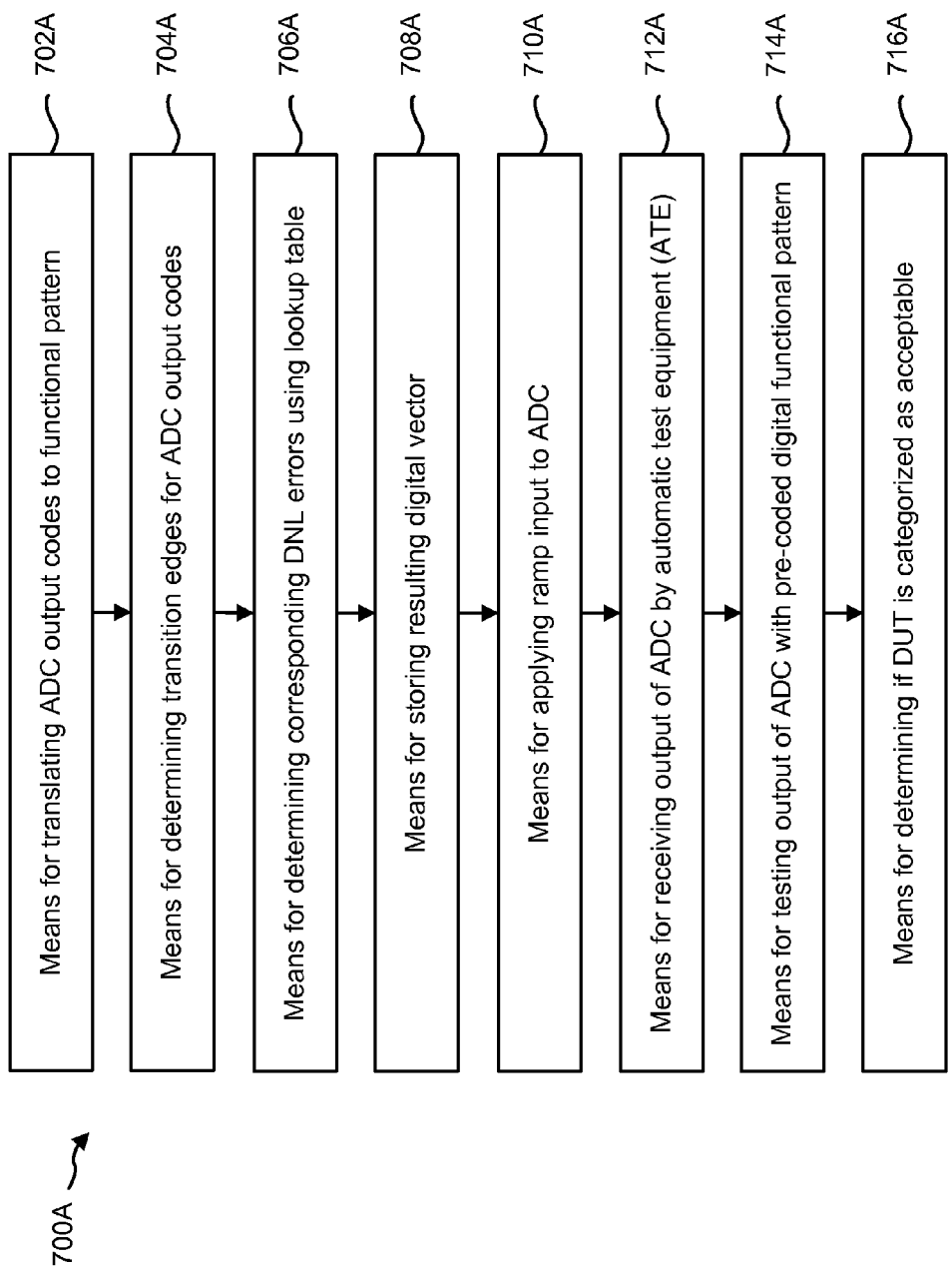
FIG. 7A illustrates means-plus-function blocks corresponding to the method of FIG. 7.

The method 700 of FIG. 7 described above may be performed by various hardware and/or software component(s) and/or module(s) corresponding to the means-plus-function blocks 700A illustrated in FIG. 7A. In other words, blocks 702 through 716 illustrated in FIG. 7 correspond to means-plus-function blocks 702A through 716A illustrated in FIG. 7A.

Figure 8:
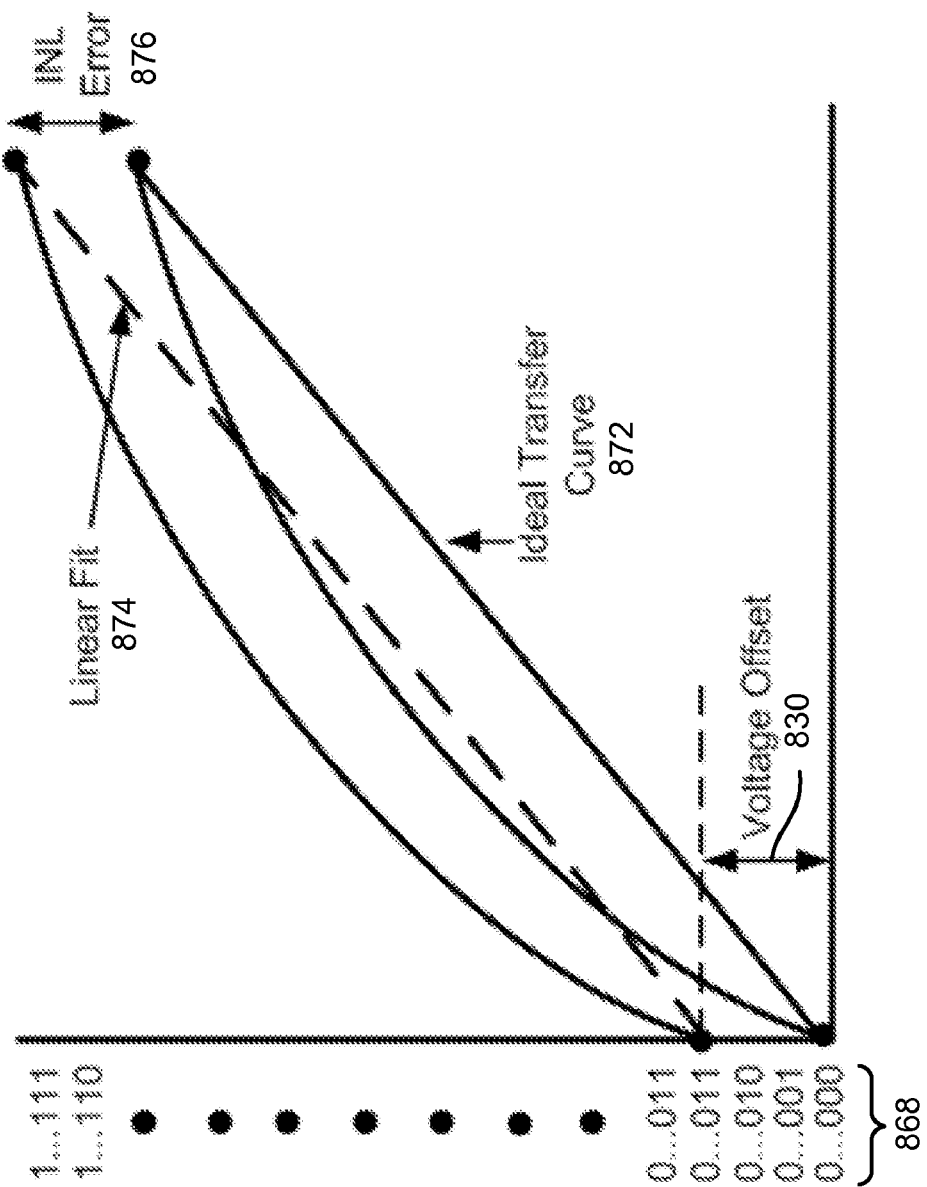
FIG. 8 illustrates an ideal and an erroneous ADC output step transition with Hits Per Code (HPC)=k.

FIG. 8 illustrates an ideal and an erroneous ADC 326 output step transition with Hits Per Code (HPC)=k. The y-axis shows the output 868 of an ADC 326, and the x-axis shows the input to the ADC 326. The ADC 326 may be on a DUT 104. INL errors are ADC response linearity errors. INL errors may occur with or without an initial voltage offset. INL may be represented as the cumulative sum of the DNL values processed for all the preceding output codes 538 as shown in Equation (5):

$$INL(i) = \sum_{j=1}^{i} DNL(j) \qquad (5)$$

As shown in FIG. 8, the INL value 876 (or INL error 876) may be used as a measure of ADC response linearity. The INL value 876 is the deviation of the output code 538 from the ideal code value in terms of LSB or full scale range (FSR). The ideal ADC transfer function 872 may be linear with axial intercepts at (0, 0) and (max_code, max_in) corners. Any deviation from these transfer function end points may result in an offset 830 and error 876, captured by INL calculation. The linear fit 874 denotes the ideal ADC response where the ADC output is linearly proportional to the ADC input.

The functional vector used for DNL detection may also be used for detection of INL errors, as any non-linear transfer curve shift would result in an adjacent code being erroneously generated at the ADC output. Depending on the 1×LSB error margin limit added while generating the vector, a DUT 104 with excessive INL error can be screened. The predetermined INL spec may be coded into the test vector, thereby allowing an error margin to comply with the spec.

Figure 9:
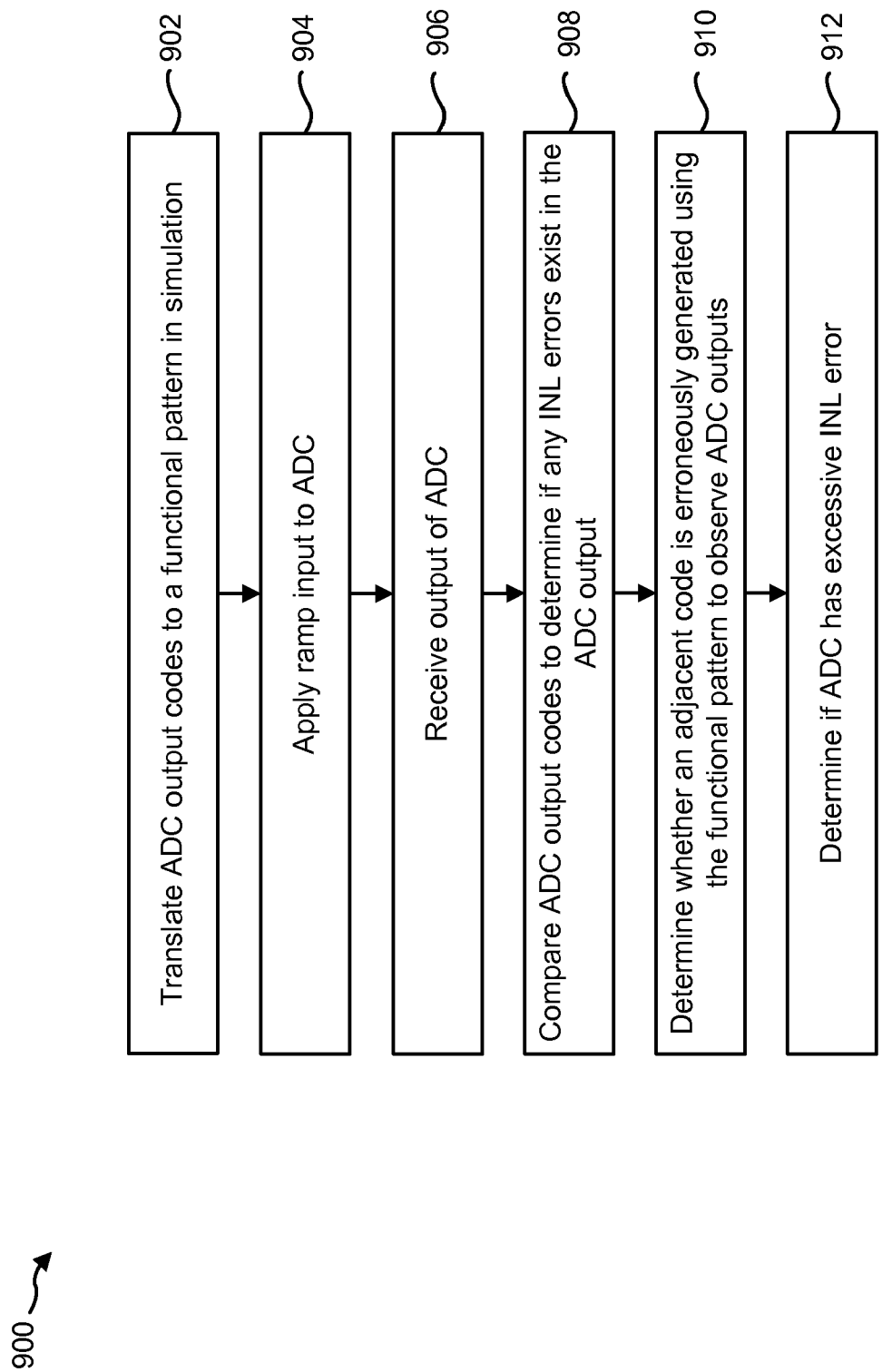
FIG. 9 is a flow diagram illustrating a method for vector based analog to digital converter (ADC) sequential testing of Integral Non-Linearity (INL) errors.

FIG. 9 is a flow diagram illustrating a method 900 for vector based analog to digital converter (ADC) 326 sequential testing of Integral Non-Linearity (INL) errors. ADC output codes may be translated 902 into a functional pattern to generate a digital lookup table 224. The ADC 326 may be on a DUT 104. To determine the INL error 876, the ATE 102 may apply 904 a ramp input to the ADC 326. The ATE 102 may then receive 906 the output codes 538 from the ADC 326. The ATE 102 may compare 908 the ADC output codes 538 to determine if any INL errors exist in the ADC output. The ATE 102 may next determine 910 whether an adjacent code 538 in the functional pattern has been erroneously generated using the functional pattern to observe ADC outputs. The ATE 102 may then determine 912 if the ADC 326 has excessive INL error 876 (e.g., by comparing the INL error 876 with a defined threshold).

Figure 9A:
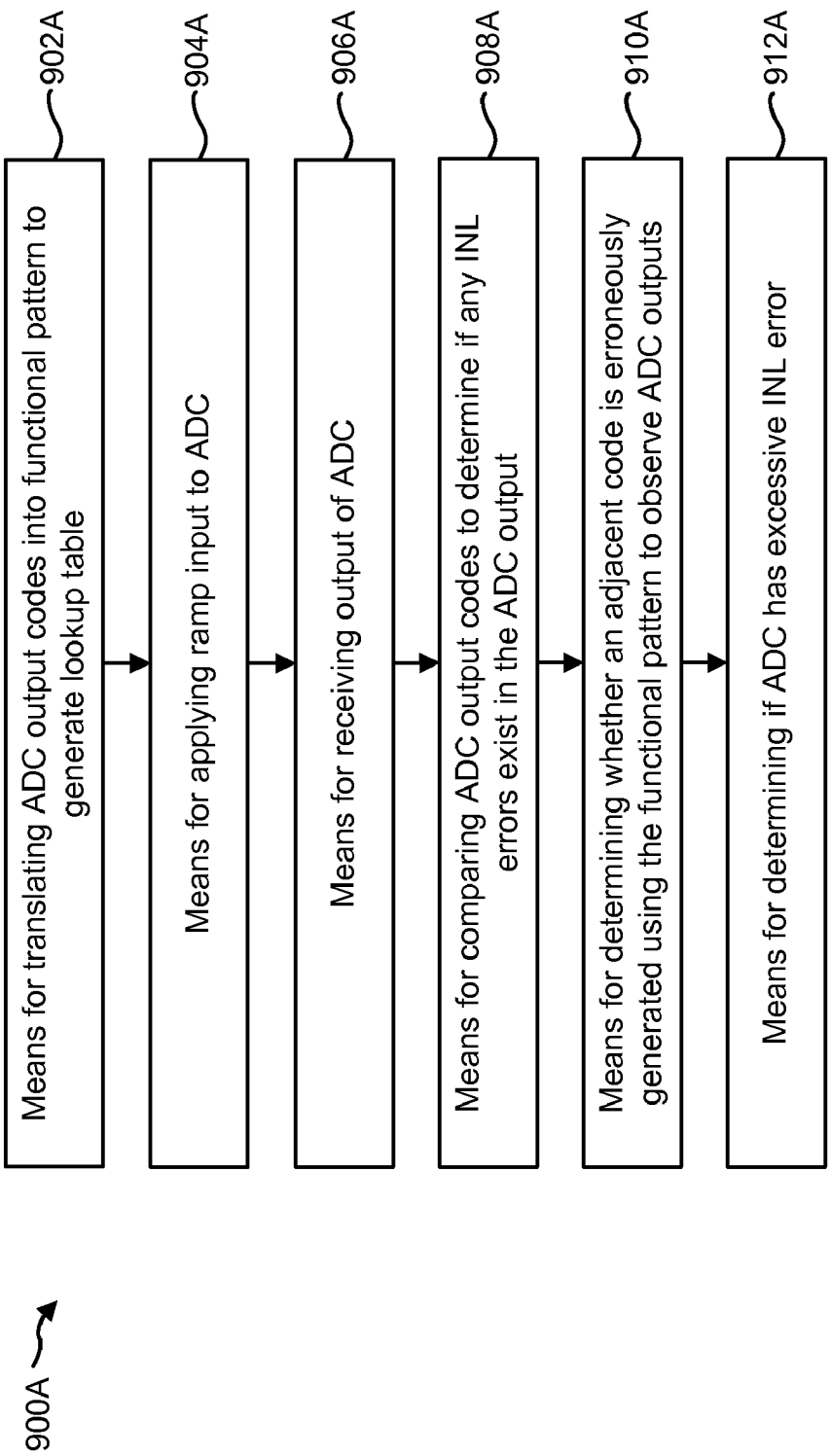
FIG. 9A illustrates means-plus-function blocks corresponding to the method of FIG. 9.

The method 900 of FIG. 9 described above may be performed by various hardware and/or software component(s) and/or module(s) corresponding to the means-plus-function blocks 900A illustrated in FIG. 9A. In other words, blocks 902 through 912 illustrated in FIG. 9 correspond to means-plus-function blocks 902A through 912A illustrated in FIG. 9A.

Figure 10:
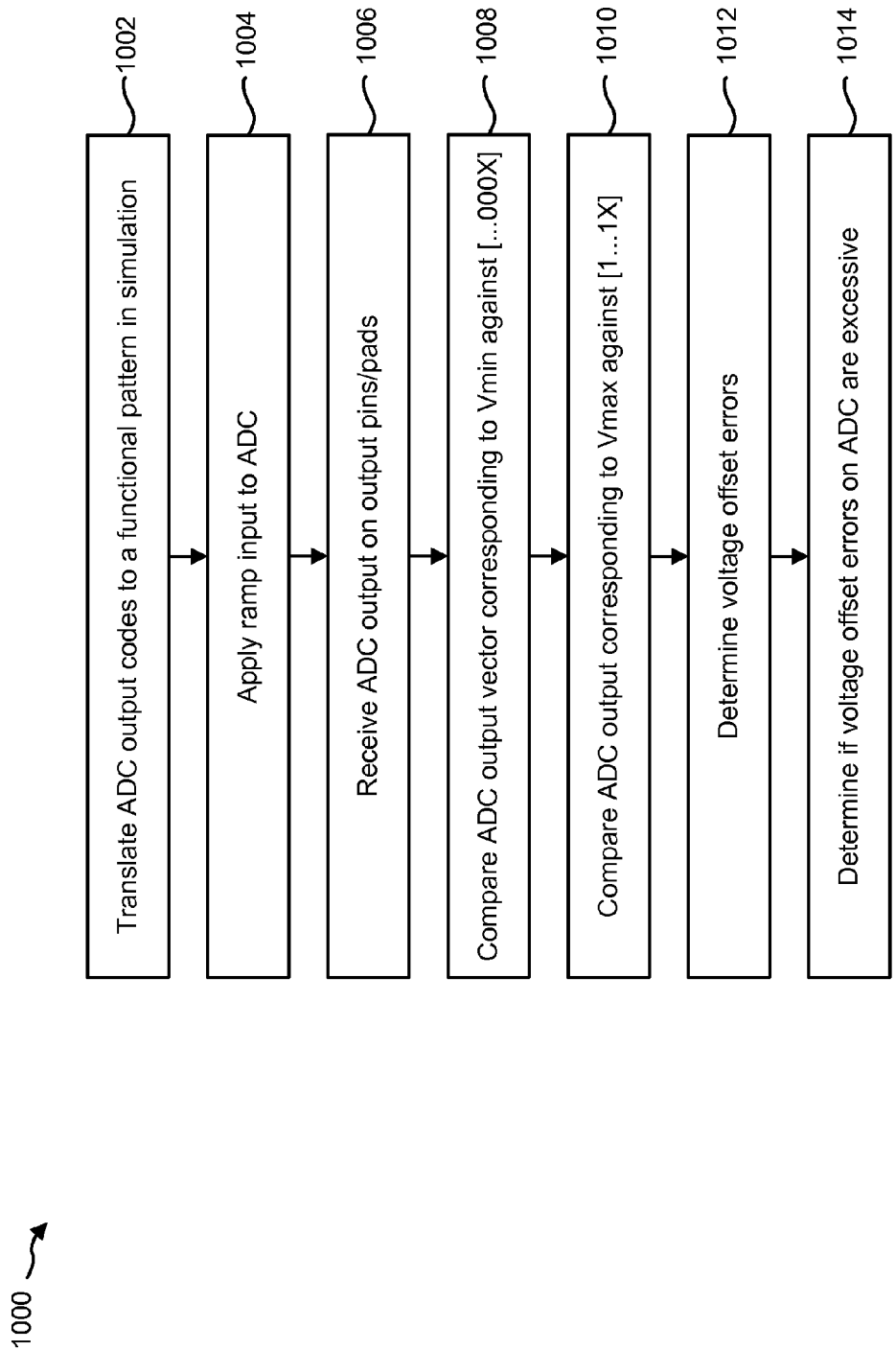
FIG. 10 is a flow diagram illustrating a method for vector based analog-to-digital converter (ADC) sequential testing of voltage offset errors.

FIG. 10 is a flow diagram illustrating a method 1000 for vector based analog-to-digital converter (ADC) 326 sequential testing of voltage offset errors. The ADC 326 may be on a DUT 104. Voltage offset errors may represent the deviation of the ADC response curve from the ideal response in terms of the LSB count of the ADC 326. The voltage offset may be calculated according to Equation (6):

$$Offset = \frac{H(2^n) - H(1)}{2 \times H_{ideal}} \qquad (6)$$

Expected ADC output codes may be translated 1002 to a functional pattern in simulation. An ATE 102 may apply 1004 a ramp input to the ADC 326. The ATE 102 may then receive 1006 output codes 538 from the ADC 326. The ATE 102 may receive 1006 the ADC output codes 538 using the output pins or pads. A functional pattern may include multiple ADC output vectors which may be calculated on the basis of expected ADC output values.

If a 1-bit LSB offset is permitted by the specification, the ADC output vector corresponding to $V_{min}$ may be compared 1008 against [ . . . 000X], where 'X' denotes a don't care compare operation. A similar offset can be screened at $V_{max}$, by comparing 1010 the ADC output code 538 corresponding to $V_{max}$ against [1 . . . 1X]. The ADC output code level 536 is expected to be [1 . . . 1] and voltage offset errors 830 can be determined 1012 by this comparison in terms of device LSB counts that are ignored by using the "don't care" condition "X." The ATE 102 may then determine 1014 if the voltage offset errors 830 on the ADC 326 are excessive (e.g., by comparing the voltage offset errors 830 with one or more defined thresholds). Similar tests may be devised for computing the ADC gain by comparing ADC output code 538 values against the lookup tables/functional patterns.

Figure 10A:
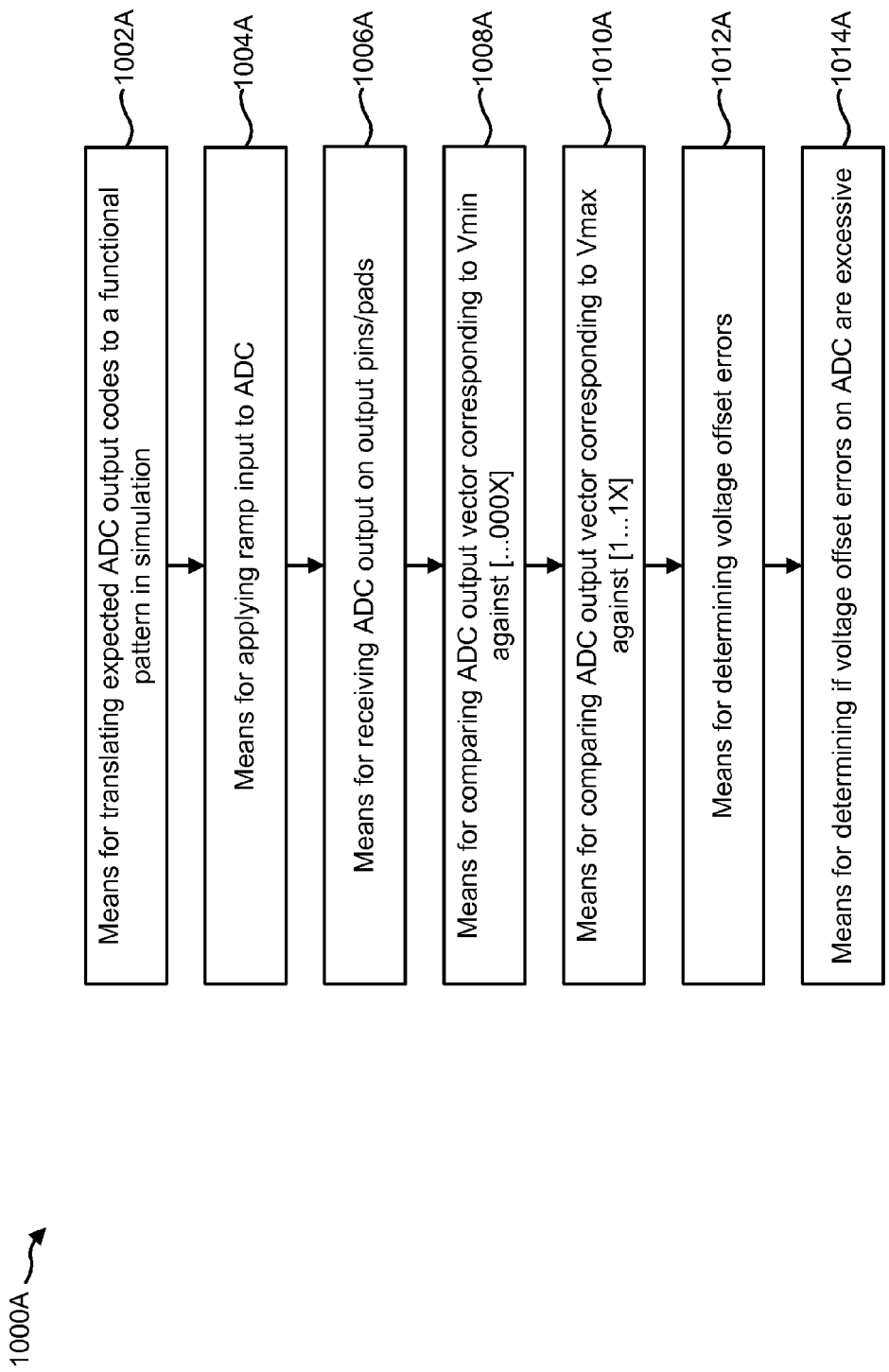
FIG. 10A illustrates means-plus-function blocks corresponding to the method of FIG. 10.

The method 1000 of FIG. 10 described above may be performed by various hardware and/or software component(s) and/or module(s) corresponding to the means-plus-function blocks 1000A illustrated in FIG. 10A. In other words, blocks 1002 through 1014 illustrated in FIG. 10 correspond to means-plus-function blocks 1002A through 1014A illustrated in FIG. 10A.

Figure 11:
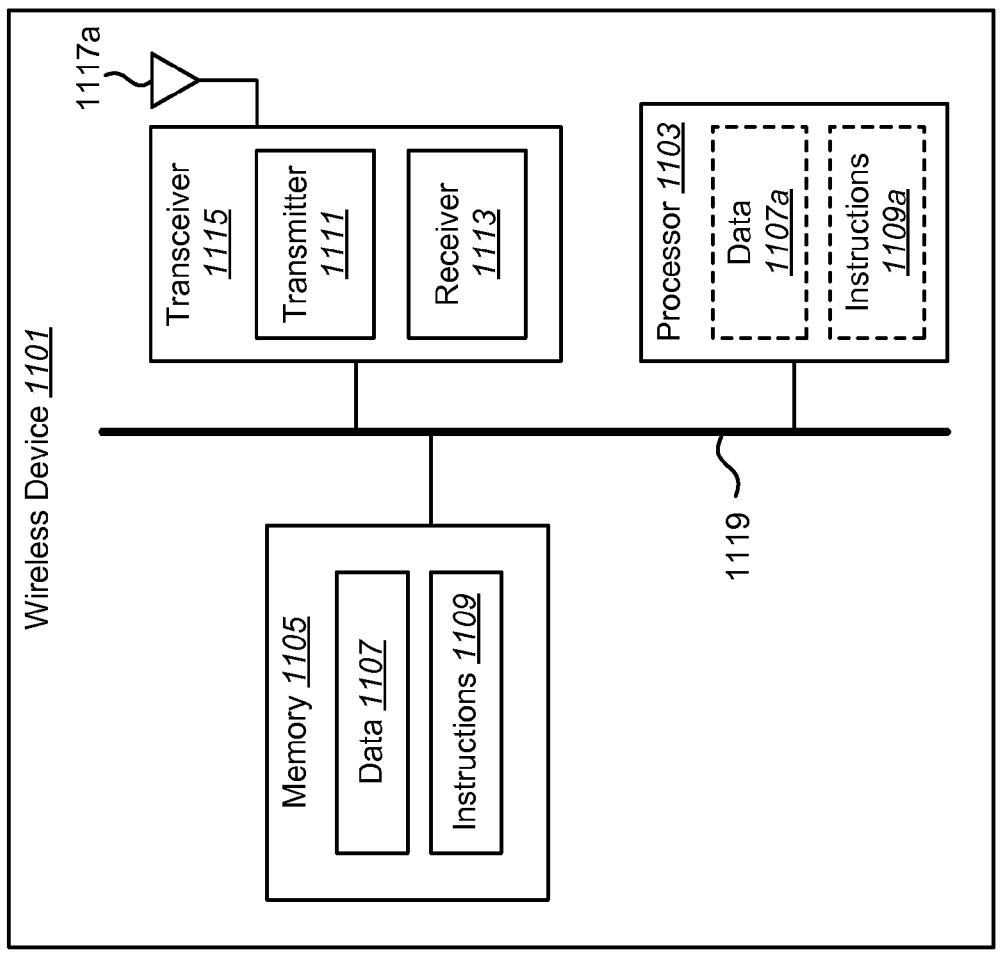
FIG. 11 is a block diagram illustrating certain components that may be included within a wireless device that is configured in accordance with the present disclosure.

FIG. 11 illustrates certain components that may be included within a wireless device 1101. The wireless device 1101 may be a mobile device/station or a base station. Examples of mobile stations include cellular phones, hand-held wireless devices, wireless modems, laptop computers, personal computers, etc. A mobile station may alternatively be referred to as an access terminal, a mobile terminal, a subscriber station, a remote station, a user terminal, a terminal, a subscriber unit, user equipment, etc. The present systems and methods may be used on an integrated circuit 106 that may be part of a wireless device 1101. Additionally, the present systems and methods may be used on an integrated circuit 106 that may be an electronic device that is not a wireless device 1101. However, the electronic device block diagram and components would be similar to the wireless device 1101 of FIG. 11 except that the electronic device may not have a transceiver 1115.

The wireless device 1101 includes a processor 1103. The processor 1103 may be a general purpose single- or multi-chip microprocessor (e.g., an ARM), a special purpose microprocessor (e.g., a digital signal processor (DSP)), a microcontroller, a programmable gate array, etc. The processor 1103 may be referred to as a central processing unit (CPU). Although just a single processor 1103 is shown in the wireless device 1101 of FIG. 11, in an alternative configuration, a combination of processors (e.g., an ARM and DSP) could be used.

The wireless device 1101 also includes memory 1105. The memory 1105 may be any electronic component capable of storing electronic information. The memory 1105 may be embodied as random access memory (RAM), read only memory (ROM), magnetic disk storage media, optical storage media, flash memory devices in RAM, on-board memory included with the processor, EPROM memory, EEPROM memory, registers, and so forth, including combinations thereof.

Data 1107 and instructions 1109 may be stored in the memory 1105. The instructions 1109 may be executable by the processor 1103 to implement the methods disclosed herein. Executing the instructions 1109 may involve the use of the data 1107 that is stored in the memory 1105. When the processor 1103 executes the instructions 1107, various portions of the instructions 1109a may be loaded onto the processor 1103, and various pieces of data 1107a may be loaded onto the processor 1103.

The wireless device 1101 may also include a transmitter 1111 and a receiver 1113 to allow transmission and reception of signals to and from the wireless device 1101. The transmitter 1111 and receiver 1113 may be collectively referred to as a transceiver 1115. An antenna 1117 may be electrically coupled to the transceiver 1115. The wireless device 1101 may also include (not shown) multiple transmitters, multiple receivers, multiple transceivers and/or multiple antenna.

The various components of the wireless device 1101 may be coupled together by one or more buses, which may include a power bus, a control signal bus, a status signal bus, a data bus, etc. For the sake of clarity, the various buses are illustrated in FIG. 11 as a bus system 1119.

The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

The term "processor" should be interpreted broadly to encompass a general purpose processor, a central processing unit (CPU), a microprocessor, a digital signal processor (DSP), a controller, a microcontroller, a state machine, and so forth. Under some circumstances, a "processor" may refer to an application specific integrated circuit (ASIC), a programmable logic device (PLD), a field programmable gate array (FPGA), etc. The term "processor" may refer to a combination of processing devices, e.g., a combination of a DSP and a microprocessor, a plurality of microprocessors, one or more microprocessors in conjunction with a DSP core, or any other such configuration.

The term "memory" should be interpreted broadly to encompass any electronic component capable of storing electronic information. The term memory may refer to various types of processor-readable media such as random access memory (RAM), read-only memory (ROM), non-volatile random access memory (NVRAM), programmable read-only memory (PROM), erasable programmable read only memory (EPROM), electrically erasable PROM (EEPROM), flash memory, magnetic or optical data storage, registers, etc. Memory is said to be in electronic communication with a processor if the processor can read information from and/or write information to the memory. Memory that is integral to a processor is in electronic communication with the processor.

The terms "instructions" and "code" should be interpreted broadly to include any type of computer-readable statement(s). For example, the terms "instructions" and "code" may refer to one or more programs, routines, subroutines, functions, procedures, etc. "Instructions" and "code" may comprise a single computer-readable statement or many computer-readable statements.

The functions described herein may be implemented in hardware, software, firmware, or any combination thereof. If implemented in software, the functions may be stored as one or more instructions on a computer-readable medium. The terms "computer-readable medium" or "computer-program product" refers to any available medium that can be accessed by a computer. By way of example, and not limitation, a computer-readable medium may comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray® disc where disks usually reproduce data magnetically, while discs reproduce data optically with lasers.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of transmission medium.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

Further, it should be appreciated that modules and/or other appropriate means for performing the methods and techniques described herein, such as those illustrated by FIGS. 4, 7, 9 and 10, can be downloaded and/or otherwise obtained by a device. For example, a device may be coupled to a server to facilitate the transfer of means for performing the methods described herein. Alternatively, various methods described herein can be provided via a storage means (e.g., random access memory (RAM), read only memory (ROM), a physical storage medium such as a compact disc (CD) or floppy disk, etc.), such that a device may obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the systems, methods, and apparatus described herein without departing from the scope of the claims.

What is claimed is:

1. A method for providing a built-in self test (BiST) for an analog-to-digital converter (ADC) by automatic test equipment (ATE), comprising:
   receiving output codes from the ADC;
   translating the output codes to generate a functional pattern; and
   determining performance metrics for the ADC using the functional pattern.

2. The method of claim 1, further comprising:
   determining transition edges for the output codes;
   determining Differential Non-Linearity (DNL) errors corresponding to the transition edges using a lookup table, wherein DNL errors are a performance metric for the ADC; and
   determining if the ADC has excessive DNL errors.

3. The method of claim 1, wherein the ADC is on a device-under-test (DUT).

4. The method of claim 3, further comprising determining if the DUT is categorized as acceptable.

5. The method of claim 1, further comprising:
   determining whether an adjacent output code has been erroneously generated by the ADC; and
   determining if the ADC has excessive Integral Non-Linearity (INL) errors, wherein the INL errors are a performance metric for the ADC.

6. The method of claim 1, further comprising applying a ramp input to the ADC.

7. The method of claim 6, wherein the ramp input is generated by an input stimulus located on the same device-under-test as the ADC.

8. The method of claim 6, wherein the functional pattern comprises ADC output vectors.

9. The method of claim 8, further comprising:
   comparing an ADC output vector against an expected output code level to determine a voltage offset error, wherein voltage offset errors are a performance metric of the ADC; and
   determining if the voltage offset error on the ADC is excessive.

10. The method of claim 9, wherein the first output code level is [ . . . 000X], and wherein the 'X' in the first output code level represents a don't care operation.

11. The method of claim 10, wherein the ADC output vector corresponds to a minimum voltage of the ramp input.

12. The method of claim 9, wherein the first output code level is [1 . . . 1X], and wherein the 'X' in the first output code level represents a don't care operation.

13. The method of claim 12, wherein the ADC output vector corresponds to a maximum voltage of the ramp input.

14. The method of claim 1, wherein the ATE is a very low cost ATE (VLC-ATE).

15. A wireless device configured for providing a built-in self test (BiST) for an analog-to-digital converter (ADC), comprising:
   a processor;
   memory in electronic communication with the processor;
   instructions stored in the memory, the instructions being executable by the processor to:
      receive output codes from the ADC;
      translate the output codes to generate a functional pattern; and
      determine performance metrics for the ADC using the functional pattern.

16. The wireless device of claim 15, wherein the instructions are further executable to:
   determine transition edges for the output codes;
   determine Differential Non-Linearity (DNL) errors corresponding to the transition edges using a lookup table, wherein DNL errors are a performance metric for the ADC; and
   determine if the ADC has excessive DNL errors.

17. The wireless device of claim 15, wherein the ADC is on a device-under-test (DUT).

18. The wireless device of claim 17, wherein the instructions are further executable to determine if the DUT is categorized as acceptable.

19. The wireless device of claim 15, wherein the instructions are further executable to:
   determine whether an adjacent output code has been erroneously generated by the ADC; and determine if the ADC has excessive Integral Non-Linearity (INL) errors, wherein the INL errors are a performance metric for the ADC.

20. The wireless device of claim 15, wherein the instructions are further executable to apply a ramp input to the ADC.

21. The wireless device of claim 15, wherein the ramp input is generated by an input stimulus located on the same device-under-test as the ADC.

22. The wireless device of claim 20, wherein the functional pattern comprises ADC output vectors.

23. The wireless device of claim 22, wherein the instructions are further executable to:
compare an ADC output vector against an expected output code level to determine a voltage offset error, wherein voltage offset errors are a performance metric of the ADC; and
determine if the voltage offset error on the ADC is excessive.

24. The wireless device of claim 23, wherein the first output code level is [ . . . 000X], and wherein the 'X' in the first output code level represents a don't care operation.

25. The wireless device of claim 24, wherein the ADC output vector corresponds to a minimum voltage of the ramp input.

26. The wireless device of claim 22, wherein the first output code level is [1 . . . 1X], and wherein the 'X' in the first output code level represents a don't care operation.

27. The wireless device of claim 26, wherein the ADC output vector corresponds to a maximum voltage of the ramp input.

28. The wireless device of claim 15, wherein the ATE is a very low cost ATE (VLC-ATE).

29. An apparatus for providing a built-in self test (BiST) for an analog-to-digital converter (ADC), comprising:
means for receiving output codes from the ADC;
means for translating the output codes to generate a functional pattern; and
means for determining performance metrics for the ADC using the functional pattern.

30. A computer-program product for a wireless device configured for providing a built-in self test (BiST) for an analog-to-digital converter (ADC), the computer-program product comprising a non-transitory computer-readable medium having instructions thereon, the instructions comprising:
code for receiving output codes from the ADC;
code for translating the output codes to generate a functional pattern; and
code for determining performance metrics for the ADC using the functional pattern.

* * * * *